(12) United States Patent
Kato et al.

(10) Patent No.: US 8,895,875 B2
(45) Date of Patent: Nov. 25, 2014

(54) BRAIDED SHIELD MEMBER, MANUFACTURING METHOD OF BRAIDED SHIELD MEMBER, AND WIRE HARNESS

(75) Inventors: Takashi Kato, Makinohara (JP); Hidehiro Ichikawa, Kosai (JP)

(73) Assignee: Yazaki Corporation, Tokyo (JP)

( * ) Notice: Subject to any disclaimer, the term of this patent is extended or adjusted under 35 U.S.C. 154(b) by 58 days.

(21) Appl. No.: 13/700,763

(22) PCT Filed: May 31, 2011

(86) PCT No.: PCT/JP2011/062523
§ 371 (c)(1),
(2), (4) Date: Nov. 29, 2012

(87) PCT Pub. No.: WO2011/152416
PCT Pub. Date: Dec. 8, 2011

(65) Prior Publication Data
US 2013/0068518 A1    Mar. 21, 2013

(30) Foreign Application Priority Data

Jun. 2, 2010    (JP) .................. 2010-126527

(51) Int. Cl.
| | | |
|---|---|---|
| H01R 13/648 | (2006.01) | |
| H05K 9/00 | (2006.01) | |
| H02G 3/04 | (2006.01) | |
| B21F 45/06 | (2006.01) | |
| H01B 9/00 | (2006.01) | |
| H02G 3/06 | (2006.01) | |

(52) U.S. Cl.
CPC .............. *H05K 9/00* (2013.01); *H02G 3/0462* (2013.01); *H05K 9/009* (2013.01); *H05K 9/0098* (2013.01); *B21F 45/06* (2013.01); *H01B 9/006* (2013.01); *H02G 3/0675* (2013.01); *H02G 3/0683* (2013.01); *H01R 13/648* (2013.01); *H01R 2201/26* (2013.01)
USPC .......................................... 174/359; 174/376

(58) Field of Classification Search
USPC .............................. 174/359, 376, 103; 439/98
See application file for complete search history.

(56) References Cited

U.S. PATENT DOCUMENTS

| | | | | |
|---|---|---|---|---|
| 5,401,177 A | * | 3/1995 | Dutton et al. | ................... 439/98 |
| 6,781,059 B2 | | 8/2004 | Mizutani | |

(Continued)

FOREIGN PATENT DOCUMENTS

| | | | |
|---|---|---|---|
| JP | 2003-264040 A | 9/2000 | |
| JP | 2005-339933 A | 12/2005 | |

(Continued)

OTHER PUBLICATIONS

International Search Report (PCT/ISA/210) issued Aug. 30, 2011, in International Application No. PCT/JP2011/062523.
Written Opinion (PCT/ISA/237) issued Aug. 30, 2011, in International Application No. PCT/JP2011/062523.

*Primary Examiner* — Hung V Ngo
(74) *Attorney, Agent, or Firm* — Sughrue Mion, PLLC

(57) ABSTRACT

Provided are a braided shield member, a manufacturing method of a braided shield member and a wire harness which make it possible to demonstrate shielding performance sufficiently. The braided shield member constituting the wire harness includes a tubular body part and a tubular terminal part. The braided shield member is formed so that the terminal part is formed in a two-folded structure of an outside terminal part and an inside terminal part. Further, the braided shield member is formed so that metal wires are in a loose state inside stitches of the outside terminal part.

8 Claims, 5 Drawing Sheets

(56) References Cited

U.S. PATENT DOCUMENTS

| | | |
|---|---|---|
| 7,331,823 B2 | 2/2008 | Fukushima et al. |
| 2003/0024717 A1* | 2/2003 | Knighten et al. ............ 174/35 R |
| 2003/0221850 A1* | 12/2003 | Mizutani .......................... 174/36 |
| 2004/0099427 A1* | 5/2004 | Kihira .......................... 174/35 C |
| 2005/0266729 A1 | 12/2005 | Fukushima et al. |
| 2013/0056256 A1* | 3/2013 | Guillanton et al. ............ 174/359 |

FOREIGN PATENT DOCUMENTS

| | | |
|---|---|---|
| JP | 2008-262759 A | 10/2008 |
| JP | 2009-129697 A | 6/2009 |

\* cited by examiner (a)

(b)　　　(c)

BRAIDED SHIELD MEMBER, MANUFACTURING METHOD OF BRAIDED SHIELD MEMBER, AND WIRE HARNESS

CROSS REFERENCE TO RELATED APPLICATIONS

This application is a National Stage entry of International Application No. PCT/JP2011/062523 filed May 31, 2011, claiming the benefit of Application No. JP 2010-126527 field Jun. 2, 2010, in the Japanese Patent Office (JPO), the discloser of which are incorporated herein in their entirety.

TECHNICAL FIELD

The present invention relates to a braided shield member formed of braided conductors and a method of manufacturing the braided shield member, and further relates to a wire harness which contains the braided shield member.

BACKGROUND ART

A high voltage wire harness for electrically connecting between devices mounted in a vehicle, such as an electric vehicle or a hybrid vehicle is disclosed in Patent Literature 1 in detail, for example. Patent Literature 1 is proposed by the applicant for the present application. Next, Patent Literature 1 is described in brief.

In FIGS. 4(a) and 4(b), a wire harness 1 includes a plurality of high voltage electric wires 2, a braided shield member 3 which collectively covers the plurality of high voltage electric wires 2, a shielding shell 4 which is fixed to a shielding casing of a device which is not shown in the figure, a ring member 5 which is held to the braided shield member 3, and a band 8 whose diameter is reduced with the fastening of a bolt 6 and a nut 7. The ring member 5 and the band 8 are used when a terminal part 9 of the braided shield member 3 is fixed to an annular part 10 of the shielding shell 4.

In FIGS. 4(a) to 5, the braided shield member 3 is formed of a tubular braided conductor, and has a body part 11 and the above-mentioned terminal part 9 which is connected to the body part 11. The terminal part 9 is formed so that its inner diameter may be expanded to be larger than the inner diameter of the body part 11. In particular, the terminal part 9 is formed by expanding the inner diameter. The terminal part 9 is formed in a two-folded structure by bending the end 12 inwards in an axial direction. This two-folded structure is formed to have an outside terminal part 13 and an inside terminal part 14. The terminal part 9 is formed to correspond to a range part as shown with a reference sign D. That is, the inside terminal part 14 which is formed by bending the end 12 to the inside is formed in the range of the reference sign D.

In order to fix the terminal part 9 of the braided shield member 3 to the annular part 10 of the shielding shell 4, the ring member 5 is arranged between the outside terminal part 13 and the inside terminal part 14 first, and the braided shield member 3 is inserted in the shielding shell 4 so that the annular part 10 is placed inside the inside terminal part 14. Next, the terminal part 9 is fastened with the annular part 10, and when the band 8 is finally fastened according to the position of the annular part 10 from the outside of the outside terminal part 13, the above-mentioned fixing will be completed.

In the above-mentioned composition and structure, since the inner diameter of the terminal part 9 is expanded to be larger than the inner diameter of the body part 11, the stitch 15 shown in FIG. 5 will be opened larger than the stitch 16 of the body part 11. If the opening area of the stitch 15 is expanded, the deterioration of shielding performance may be worried, but in the terminal part 9, the performance deterioration is prevented by forming the two-folded structure. That is, the performance deterioration is prevented by forming the inside terminal part 14 in the range of the reference sign D.

The braided conductor is explained supplementarily. One of the stitches 15 is called a pick 19, and the pick 19 includes one or more metal wires 18. The number of the metal wires 18 is called the number of ends, and the number of the picks 19 in a round of the braided conductor is called the number of spindles. The above-mentioned supplementary explanation is also disclosed in Patent Literature 2 proposed by the applicant for the present application.

CITATION LIST

Patent Literature

Patent Literature 1: JP-A-2005-339933
Patent Literature 2: JP-A-2008-262759

SUMMARY OF INVENTION

Technical Problem

In the above-mentioned related art, the terminal part 9 has a two-folded structure of the outside terminal part 13 and the inside terminal part 14, and may have a possibility that the following will happen. That is, since the outside terminal part 13 and the inside terminal part 14 are made of the same braided conductors, and have the same number of ends and number of spindles, the stitch 15 of the outside terminal part 13 will open with the same area as the stitch 15 of the inside terminal part 14. Therefore, when the internal and external stitches 15 are supposed to be overlapped exactly, it is possible that the deterioration of shielding performance needs to be worried.

The present invention is made in view of the above-mentioned situation, and an object of the invention is to provide a braided shield member, a manufacturing method of a braided shield member, and a wire harness which make it possible to demonstrate shielding performance sufficiently.

Solution to Problem

The above problems are solved with the following configurations of the invention.

(1) A braided shield member, including: a tubular body part; and a tubular terminal part that is continuous from the body part, wherein an inner diameter of the terminal part is expanded to be larger than an inner diameter of the body part, the terminal part is formed in a two-folded structure of an outside terminal part and an inside terminal part by bending an end of the terminal part inwards in an axial direction of the braided shield member, the end of the terminal part is in a cut state where the end of the terminal part is unprocessed, and the inside terminal part including the end in the cut state is formed in a loose state in which metal wires are loosed.

(2) The braided shield member according to the configuration (1), wherein the loose state of the inside terminal part is formed so that the metal wires inside stitches of the outside terminal part are crossed, as opposed to the stitches of the outside terminal part.

(3) The braided shield member according to the configuration (1) or (2), wherein the end of the terminal part is arranged at a continuation position with the body part or arranged near the continuation position.

(4) A manufacturing method of a braided shield member, the method including: a first procedure of cutting a tubular braided conductor into a predetermined length and forming a body part and a terminal part which is continuous from the body part; and a second procedure in which an inner diameter of the terminal part is expanded to be larger than an inner diameter of the body part, and the terminal part is formed in a two-folded structure of an outside terminal part and an inside terminal part by bending an end of the terminal part inwards in an axial direction of the braided shield member, wherein the second procedure includes a loose state forming procedure in which the inside terminal part including the end in the cut state is formed in a loose state in which metal wires are loosed.

(5) The manufacturing method of the braided shield member according to the configuration (4), wherein the loose state is formed by untying a bundle of the metal wires in each pick which forms the braided conductor.

(6) A wire harness, including: the braided shield member according to any one of the configurations (1) to (3); and a plurality of conducting paths collectively covered with the braided shield member.

According to the braided shield member of the configuration (1), by forming the inside terminal part of the terminal part which has the two-folded structure of the outside terminal part and the inside terminal part in a loose state in which metal wires are loosed, the opening area of the stitches of the terminal part is reduced, and as a result, an effect is achieved that the deterioration of shielding performance can be prevented. Therefore, an effect is achieved that shielding performance can be demonstrated sufficiently.

According to the braided shield member of the configuration (2), by forming the loose state so that the metal wires inside the stitches of the outside terminal part are crossed, an effect is achieved that the opening area of the stitches of the terminal part can be reduced more reliably. Therefore, effects are achieved that the deterioration of shielding performance can be prevented and that shielding performance can be demonstrated sufficiently.

According to the braided shield member of the configuration (3), an effect is achieved that the deterioration of shielding performance in a range where the inner diameter of braided conductors is expanded can be prevented.

According to the manufacturing method of the braided shield member of the configuration (4), by including the procedure of forming the inside terminal part of the terminal part which has the two-folded structure of the outside terminal part and the inside terminal part in a loose state in which metal wires are loosed, an effect is achieved that the braided shield member which can demonstrate shielding performance sufficiently can be manufactured.

According to the manufacturing method of the braided shield member of the configuration (5), by forming the loose state by untying the bundle of metal wires, an effect is achieved that the braided shield member which can demonstrate shielding performance sufficiently can be manufactured.

According to the wire harness of the configuration (6), an effect is achieved that the wire harness which can demonstrate shielding performance sufficiently can be provided.

BRIEF DESCRIPTION OF DRAWINGS

In FIG. 1, (a) to (c) are diagrams which show a braided shield member and a wire harness according to one embodiment of the present invention, in which FIG. 1(a) is a schematic view which shows an arrangement example of the wire harness, FIG. 1(b) is a perspective view which shows a terminal part of the wire harness, and FIG. 1(c) is an explanatory view of a composition of the wire harness.

In FIG. 3, (a) to (c) are diagrams which show how a loose state of an inside terminal part is formed, in which FIG. 3(a) is a diagram which shows a cut state, FIG. 3(b) is a diagram which shows a state that a bundle of metal wires are untied, and FIG. 3(c) is a diagram which shows a state that the bundle of metal wires are further untied.

MODES FOR CARRYING OUT INVENTION

Figure 1:
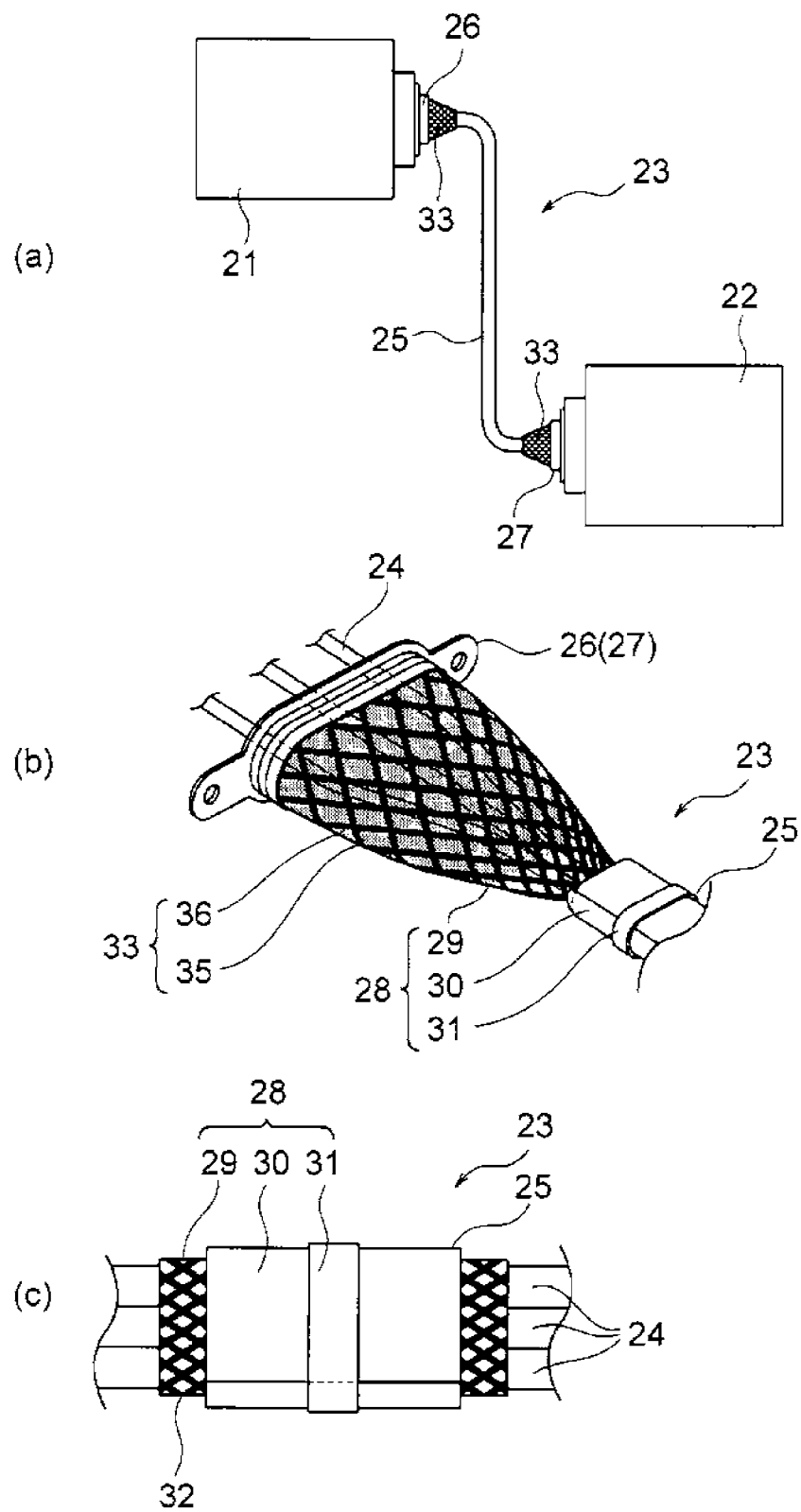

A braided shield member which forms a wire harness according to one embodiment of the invention has a tubular body part and a terminal part. The braided shield member is formed so that the terminal part becomes a two-folded structure of an outside terminal part and an inside terminal part, and the inside terminal part is formed so that metal wires are in a loose state inside the stitches of the outside terminal part.
Embodiments Next, one embodiment is described with reference to the drawings. FIGS. 1(a) to 1(c) are diagrams which show a braided shield member and a wire harness according to the embodiment of the present invention. FIG. 2 is a diagram which shows a terminal part of the braided shield member, and FIGS. 3(a) to 3(c) are diagrams which show how a loose state of an inside terminal part is formed.

The wire harness of this embodiment is not particularly limited, but may be arranged in a hybrid vehicle or an electric vehicle. In particular, the wire harness is a high voltage wire harness, and may be a wire harness that is arranged to connect a motor and an inverter, a wire harness that is arranged to connect an inverter and a battery, or a wire harness that is arranged to connect devices (for example, devices such as an electric junction box). Below, the wire harness which connects a motor and an inverter is described as an example.

In FIGS. 1(a) to 1(c), a motor 21 and an inverter 22 in an electric vehicle or a hybrid vehicle are electrically connected with a wire harness 23 (it is also called a motor cable). The wire harness 23 includes a harness body 25 containing a plurality of high voltage electric wires 24 (conducting path), a motor side connecting part 26 provided at one end (terminal part) of the harness body 25, and an inverter side connecting part 27 provided at the other end (terminal part) of the harness body 25. Next, the components of the wire harness 23 are described.

The above-mentioned harness body 25 includes a plurality of high voltage electric wires 24, and a protective member 28 which collectively covers the plurality of high voltage electric wires 24. The high voltage electric wire 24 is an electric wire for high voltage (high voltage cable), and three high voltage electric wires are used in this embodiment. The three high voltage electric wires 24 are the same, and used together. The high voltage electric wire 24 includes a conductor part and a covering part which covers the conductor part. The conductor part is not particularly limited, but is formed of stranded conductors made of copper or aluminum. Alternatively, the conductor part may be formed of a rectangular conductor or a round conductor similarly made of copper or aluminum. The high voltage electric wire 24 in this embodiment is formed of a non-shielded electric wire. Other than an electric wire, a bus bar may be mentioned as an example of the conducting path.

The protective member 28 is a member which collectively covers the plurality of high voltage electric wires as mentioned above. The protective member 28 is formed so that an electric wire protecting function and an electromagnetic shielding function can be demonstrated, since the high voltage electric wires 24 are non-shielded electric wires.

The composition of the protective member 28 is described specifically. The protective member 28 includes a braided shield member 29 which has a function of a shielding member, an exterior member 30 which is provided outside the braided shield member 29, and a tape winding 31 which prevents the loosening of the exterior member 30.

Figure 2:
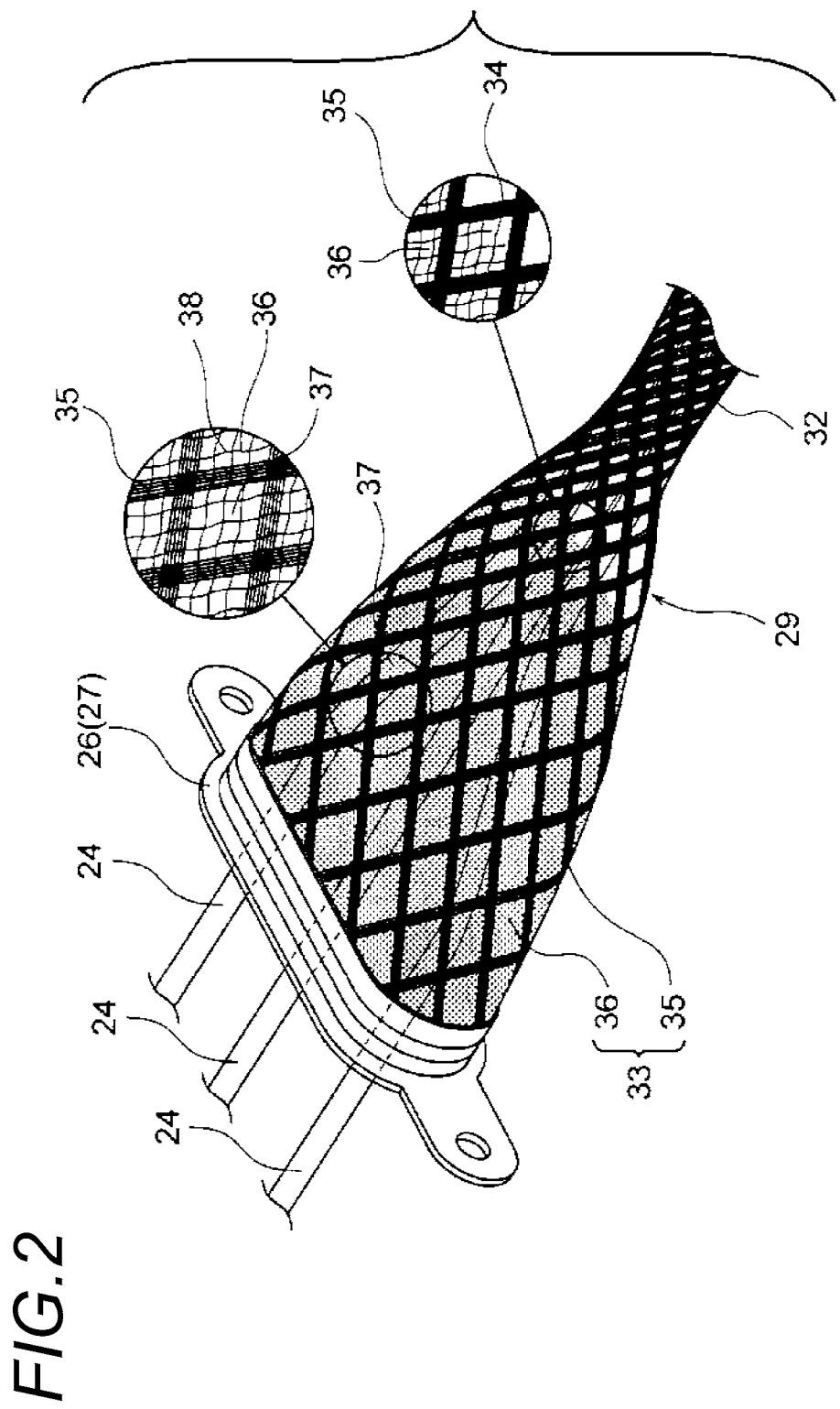
FIG. 2 is an enlarged perspective view which shows the terminal part of the braided shield member.
Figure 3:
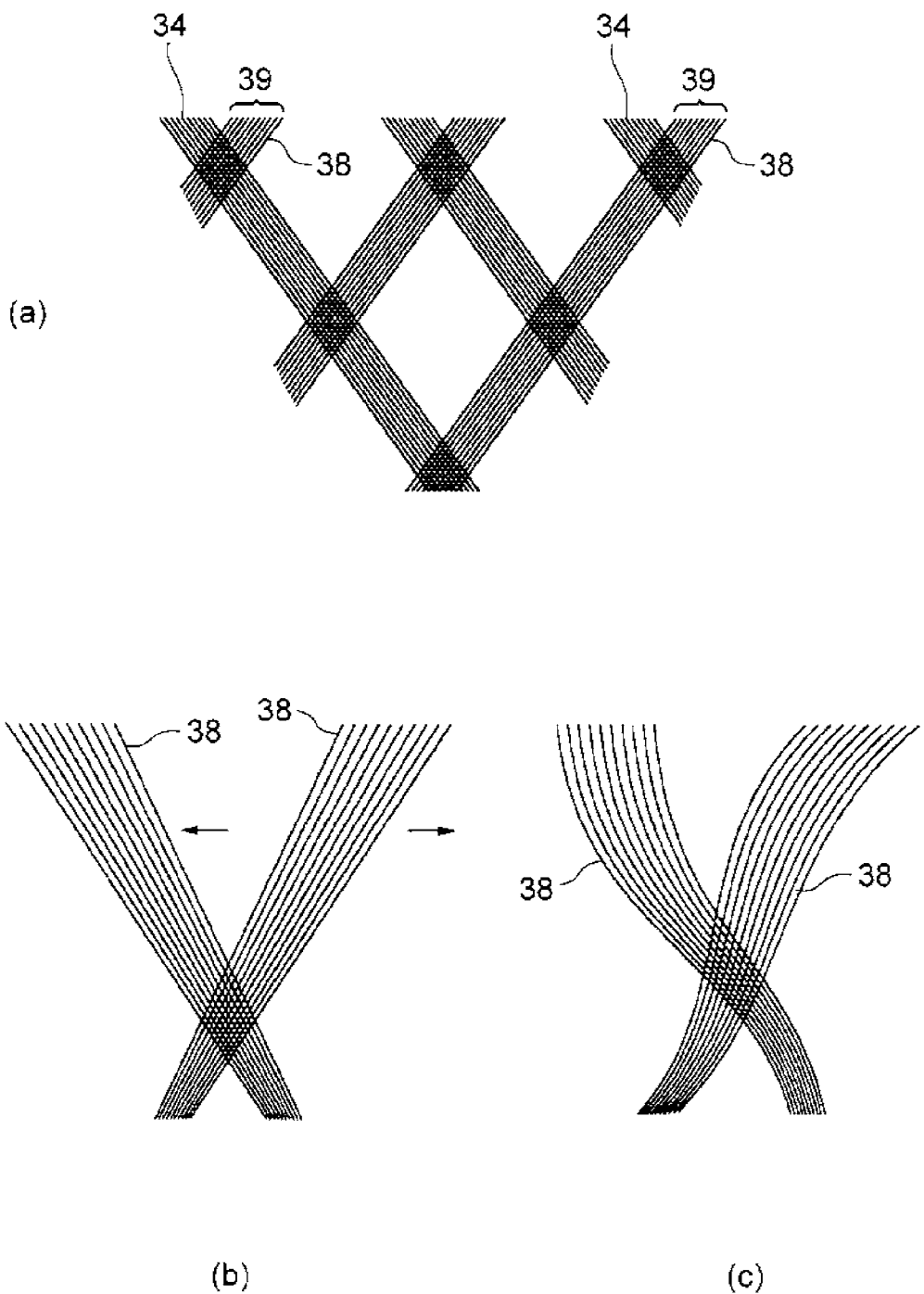
Figure 4:
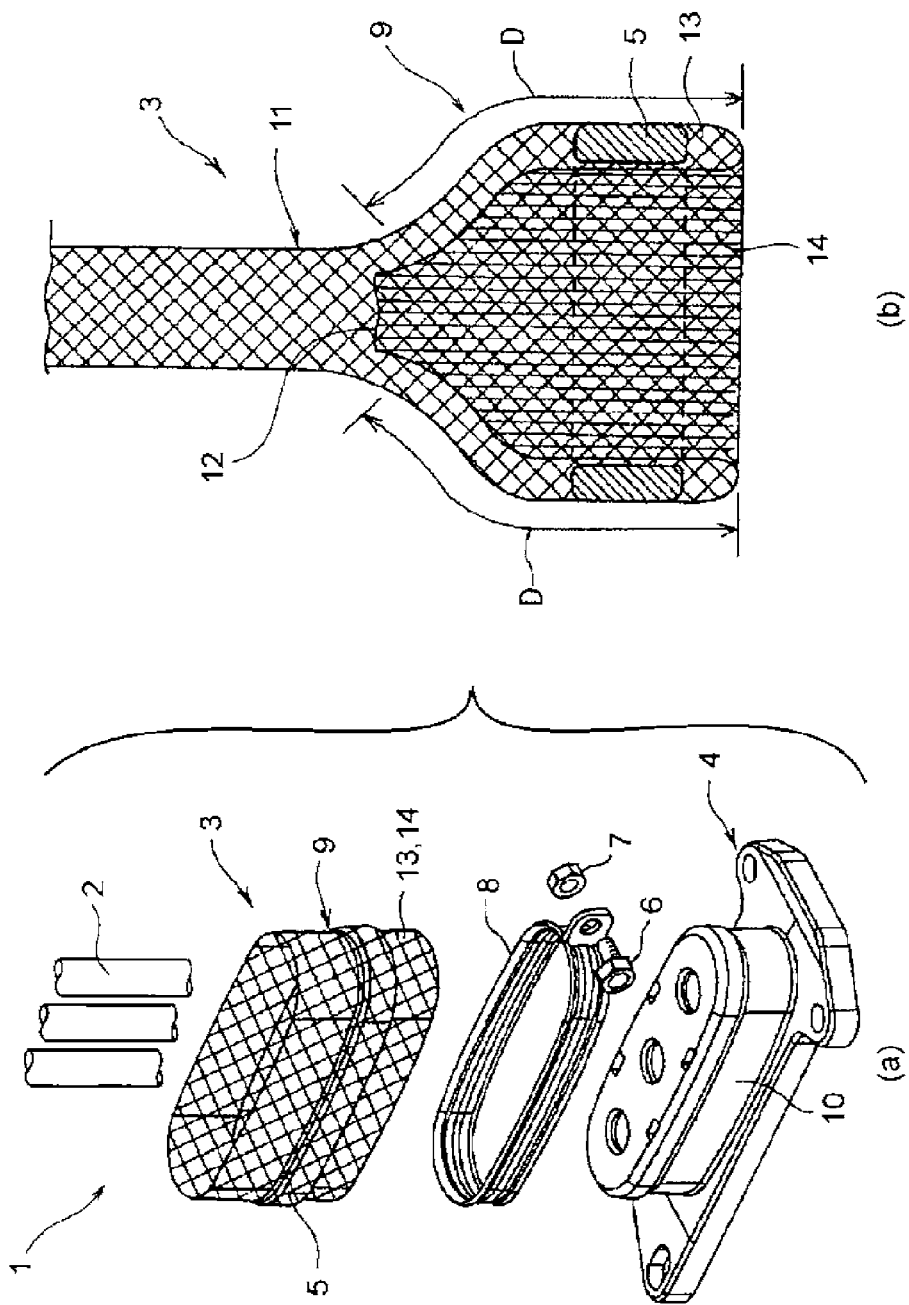
In FIG. 4, (a) is an exploded perspective view which shows a conventional example of wire harnesses, and in FIG. 4, (b) is a diagram which shows a braided shield member of FIG. 4(a).
Figure 5:
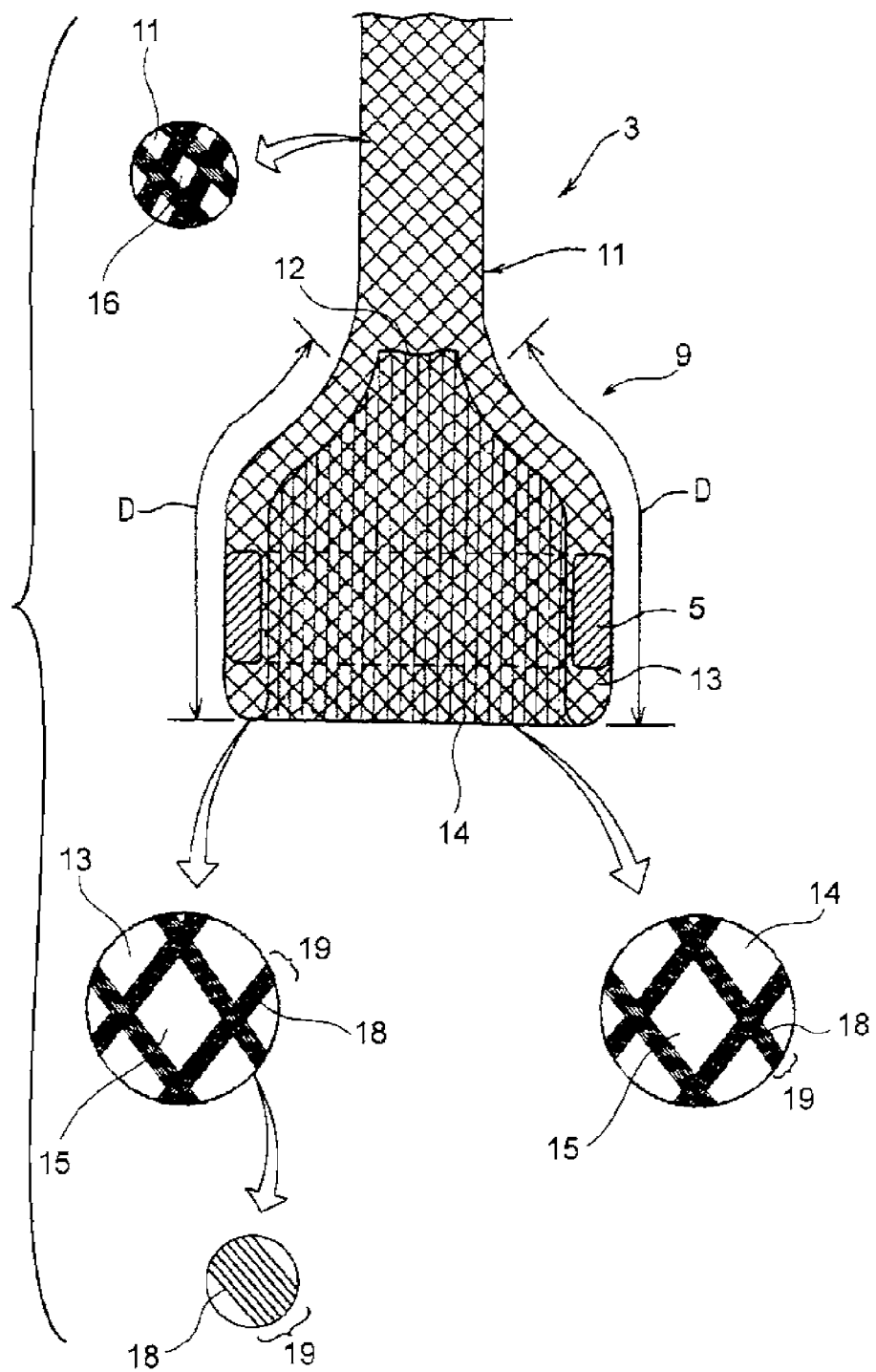
FIG. 5 is a diagram which shows the details of the braided shield member of FIG. 4(a).

In FIGS. 1(a) to 2, the braided shield member 29 is formed of braided conductors in which very thin wires, which have conductivity, are braided in a tube shape. Inside the braided shield member 29, a plurality of high voltage electric wires 24 are collectively inserted. The braided shield member 29 is not limited to the above, but may be formed in a tubular shape by winding a sheet.

The braided shield member 29 is used by cutting the tubular braided conductors into a prescribed length, and has a body part 32 and a terminal part 33 which is continuous from the body part 32. The braided shield member 29 is formed so that the inner diameter of the terminal part 33 is expanded to be larger than the inner diameter of the body part 32. The braided shield member 29 is formed so that the end 34 of the terminal part 33 is bent inwards in the axial direction to become a two-folded structure. That is, the terminal part 33 is formed in the two-folded structure which contains an outside terminal part 35 and an inside terminal part 36.

The braided shield member 29 is formed in the two-folded structure when the braided shield member 29 is cut, with the end 34 of the terminal part 33 unprocessed. After the braided shield member 29 is cut as above, the inside terminal part 36 including the end 34 is formed in a loose state in which metal wires are loosed. In FIG. 2, the inside terminal part 36 is schematically illustrated with a shading. In a circle of FIG. 2, the inside terminal part 36 is illustrated so that a loose state may be known.

Here, the above-mentioned loose state is described in more detail. The loose state indicates a state that the metal wires 38 inside a stitch 37 of the outside terminal part 35 are crossed, as opposed to the stitch 37 of the outside terminal part 35, as shown in the circle of FIG. 2. When the picks 39 each of which includes a plurality of metal wires 38 are seen as shown in FIG. 3(a), the end 34 which becomes a front end is cut (a cut state), and then, the loose state is formed by untying the bundle of metal wires 38 in each of the picks 39 as shown from FIGS. 3(b) to 3(c). The loose state is not particularly illustrated, but includes a "shaggy" form that the metal wires 38 may become.

In such a loose state, the end 34 of the terminal part 33 is set to be arranged at a continuation position with the body part 32, or to be arranged near the continuation position with the body part 32 (refer to the inside of the smaller circle in FIG. 2). The arrangement of the end 34 is set in view of the shielding performance and is not limited to the above, but may be set at a middle position in the axial direction of the terminal part 33.

The end 34 (or inside terminal part 36) of the terminal part 33 is not stopped with a tape or the like, that is, is in a tapeless or unfixed state.

A method of manufacturing the braided shield member 29 may be known from the above-mentioned description, but the method includes a first procedure of forming a body part 32 and a terminal part 33 by cutting tubular braided conductors into a predetermined length, and a second procedure in which the inner diameter of the terminal part 33 is expanded to be larger than the inner diameter of the body part 32, and the terminal part 33 is formed in a two-folded structure of the outside terminal part 35 and the inside terminal part 36 by bending the end 34 of the terminal part 33 inwards in the axial direction, wherein in the second procedure, a loose state forming procedure is performed in which the inside terminal part 36 including the end 34 in the cut state is formed in a loose state in which the metal wires 38 are loosed.

The motor side connecting part 26 or the inverter side connecting part 27 are provided at the bent part in the terminal part 33, in other words, the connecting part of the outside terminal part 35 and the inside terminal part 36 in the above-mentioned braided shield member 29. The motor side connecting part 26 or the inverter side connecting part 27 are publicly known shielding shells in this embodiment, and are formed to be able to be bolted to the shielding casing of the motor 21 or the inverter 22. The shielding shell is provided with an inner shell and an outer shell, and is formed so that the above-mentioned bent part may be put between the inner shell and the outer shell.

In FIGS. 1(a) to 1(c), the exterior member 30 is provided as a member which demonstrates a protecting function against the outside. The exterior member 30 used in this embodiment is sheet-shaped, wear resistant, and flexible (as an example). The exterior member 30 is adapted to be wound outside the braided shield member 29. As an example of the exterior member 30, for example, a twist tube may be mentioned, and the tape winding 31 may be put at a predetermined position of the exterior member 30. The whole length of the exterior member 30 is slightly shorter than the braided shield member 29, and, for this reason, the braided shield member 29 is exposed. At the boundary part where the braided shield member 29 is exposed, for example, an acetate tube (not shown) is formed by winding a tape which is made of acetate crosses. Providing the exterior member 30 may be optional.

As mentioned above, as described with reference to FIGS. 1 to 3(c), the braided shield member 29 which forms the wire harness 23 has the tubular body part 32 and the terminal part 33, and such a braided shield member 29 is formed so that the terminal part 33 becomes the two-folded structure of the outside terminal part 35 and the inside terminal part 36. The braided shield member 29 is formed so that the metal wires 38 are in a loose state inside the stitches 37 of the outside terminal part 35. Therefore, in the braided shield member 29, the opening area of the stitches 37 in the terminal part 33 is reduced, and as a result, effects are achieved that the deterioration of shielding performance can be prevented and that shielding performance can be demonstrated sufficiently.

The braided shield member, the manufacturing method of the braided shield member and the wire harness according to the present invention are described in detail with reference to the specific embodiments, but the invention is not limited to the previously described embodiments, and it is apparent that various modifications can be made without changing the purpose of the invention.

The present application is based on the Japanese patent application (patent application No. 2010-126527) filed on Jun. 2, 2010, the contents of which are incorporated herein by reference.

Industrial Applicability

According to the braided shield member, the manufacturing method of the braided shield member, and the wire harness of the invention, although the stitches of the outside terminal part in the terminal part are opened larger than the stitches of the body part, the loose state of the metal wires inside the stitches of the outside terminal part is formed, and as a result, since the opening area of the stitches in the terminal part is reduced, the deterioration of shielding performance is prevented.

REFERENCE SIGNS LIST

21: motor
22: inverter
23: wire harness
24: high voltage electric wire (conducting path)
25: harness body
26: motor side connecting part
27: inverter side connecting part
28: protective member
29: braided shield member
30: exterior member
31: tape winding
32: body part
33: terminal part
34: terminal
35: outside terminal part
36: inside terminal part
37: stitch
38: metal wire
39: pick

The invention claimed is:

1. A braided shield member, comprising:
    a tubular body part; and
    a tubular terminal part that is continuous from the body part, wherein an inner diameter of the terminal part is expanded to be larger than an inner diameter of the body part,
    the terminal part is formed in a two-folded structure of an outside terminal part and an inside terminal part by bending an end of the terminal part inwards in an axial direction of the braided shield member,
    the inside terminal part including the end of the terminal part is formed in a loose state in which metal wires of the inside terminal part are loosened more than metal wires of the outside terminal part.

2. The braided shield member according to claim 1, wherein the loose state of the inside terminal part is formed so that the metal wires inside stitches of the outside terminal part are crossed, as opposed to the stitches of the outside terminal part.

3. The braided shield member according to claim 1 wherein the end of the terminal part is arranged at a continuation position with the body part or arranged near the continuation position.

4. A wire harness, comprising:
    the braided shield member according to claim 1; and
    a plurality of conducting paths collectively covered with the braided shield member.

5. The braided shield member according to claim 1, wherein each of the outside terminal part and the inside terminal part is formed of bundles of metal wires, and
    a predetermined clearance is formed between adjacent ones of the bundles of metal wires in the outside terminal part, and the bundles of metal wires in the inside terminal part are loosened to be overlapped with the predetermined clearance in the outside terminal part.

6. The braided shield member according to claim 1, wherein the metal wires of the inside terminal part has a lower density than the metal wires of the outside terminal part.

7. A manufacturing method of a braided shield member, the method comprising:
    a first procedure of cutting a tubular braided conductor into a predetermined length and forming a body part and a terminal part which is continuous from the body part; and
    a second procedure in which an inner diameter of the terminal part is expanded to be larger than an inner diameter of the body part, and the terminal part is formed in a two-folded structure of an outside terminal part and an inside terminal part by bending an end of the terminal part inwards in an axial direction of the braided shield member, wherein
    the second procedure includes a loose state forming procedure in which the inside terminal part including the end of the terminal part in the cut state is formed in a loose state in which metal wires of the inside terminal part are loosened more than metal wires of the outside terminal part.

8. The manufacturing method of the braided shield member according to claim 7, wherein
    the loose state is formed by untying a bundle of the metal wires in each pick which forms the braided conductor.

* * * * *